United States Patent
Igarashi

[11] Patent Number: 6,110,569
[45] Date of Patent: Aug. 29, 2000

[54] CONDUCTIVE PASTE AND NON-RECIPROCAL DEVICE USING THE SAME

[75] Inventor: Katsuhiko Igarashi, Chiba, Japan

[73] Assignee: TDK Corporation, Tokyo, Japan

[21] Appl. No.: 09/173,619

[22] Filed: Oct. 16, 1998

[30] Foreign Application Priority Data

Oct. 16, 1997 [JP] Japan ................................. 9-299525

[51] Int. Cl.⁷ ...................................................... B32B 3/00
[52] U.S. Cl. ........................ 428/210; 428/325; 428/469; 428/472; 428/701; 428/702; 428/901; 252/500; 252/514; 501/17; 501/21; 501/22; 501/32
[58] Field of Search ................................... 428/325, 469, 428/472, 210, 701, 702, 901; 252/500, 514; 501/17, 21, 22, 32

[56] References Cited

FOREIGN PATENT DOCUMENTS

| | | |
|---|---|---|
| 2-234308 | 9/1990 | Japan . |
| 4-329691 | 11/1992 | Japan . |
| 5-41110 | 2/1993 | Japan . |
| 5-89717 | 4/1993 | Japan . |
| 5-89718 | 4/1993 | Japan . |
| 5-275211 | 10/1993 | Japan . |
| 9-22615 | 1/1997 | Japan . |

*Primary Examiner*—Deborah Jones
*Assistant Examiner*—Jason Resnick
*Attorney, Agent, or Firm*—Oblon, Spivak, McClelland, Maier & Neustadt, P.C.

[57] ABSTRACT

The invention is a conductor paste composition comprising a conductive material that contains silver as the essential component, and an inorganic binder as dispersed in a vehicle, wherein said inorganic binder contains, in terms of oxides, from 10 to 60% by weight of lead oxide (PbO), from 5 to 15% by weight of boron oxide ($B_2O_3$), from 2 to 15% by weight of silicon oxide ($SiO_2$), from 0.1 to 15% by weight of manganese oxide (MnO), and from 0.1 to 80% by weight of vanadium oxide ($V_2O_5$). The invention realizes a conductor paste for outer electrodes having excellent mountability, high reliability in mounting and excellent electric properties for inner electrode co-fired, non reciprocal devices, and also realizes non reciprocal devices comprising it.

4 Claims, 2 Drawing Sheets

CONDUCTIVE PASTE AND NON-RECIPROCAL DEVICE USING THE SAME

BACKGROUND OF THE INVENTION

1. Field of the Invention

The present invention relates to ceramic multilayer parts and a conductor paste to be used for forming outer conductors for the parts, in particular, to integrated, non reciprocal devices to be mounted on radiocommunication appliances and the like that are used in micro-wave and milli-wave zones, and to a conductor paste to be used for forming outer conductors for the devices.

2. Description of Related Art

With the recent great development of radiocommunication-related technology, there is increasing a demand for electronic parts for use in a high-frequency band of hundreds MHz to several GHz or higher. Radiocommunication appliances such as portable telephones are being small-sized, and high-frequency electronic parts to be mounted on those appliances are required to be small-sized and low-priced. Given that situation, ceramic multilayer parts are produced according to various integration techniques.

To produce ceramic multilayer parts, a ceramic material and a conductor material are co-fired, and the parts thus produced shall have one or more functions. For producing those ceramic multilayer parts, employed is a method comprising laminating a ceramic material and a conductor material into a laminate through printing or sheeting, followed by cutting the resulting laminate into parts having a desired shape and a desired size and then firing them, or followed by firing the laminate and then cutting it into parts having a desired shape and a desired size, and thereafter optionally forming outer conductor parts around the parts.

Therefore, the ceramic multilayer parts are so constructed that they have an inner conductor between the adjacent ceramic layers. As the inner conductor suitable to high frequency, especially to micro-waves, generally employed is Ag, Cu or the like.

However, in order to obtain ceramic multilayer parts having satisfactory properties according to the method noted above, it is considered necessary to prevent the inner conductor from being fused, and it is said that the parts must be fired at a temperature not higher than the melting point of the inner conductor. For these reasons, therefore, it is difficult to use a conductive material having a low resistivity but having a low melting point, such as Ag or Cu, for the inner conductor for ceramic materials to be fired at high temperatures.

Taking the problems noted above into consideration, we the present applicants have assiduously studied, and, as a result, have proposed a composition comprising silver to be an inner conductor and a predetermined oxide added thereto, in Japanese Patent Application No. Hei-8-197156. The inner conductor to be in the composition can be co-fired along with the above-mentioned ceramic materials.

On the other hand, in conventional ceramic multilayer parts, especially irreversible devices such as isolators or circulators, the core element is formed, for example, by sintering garnet-type ferrite (YIG: $Y_3Fe_5O_{19}$), then integrated with an inner conductor of Ag or Cu foil or the like, and electrically connected with other parts while the Cu foil is led out of the element. Accordingly, in those conventional ceramic multilayer parts, the inner conductor is integrated with the outer electrode, and the parts do not require any additional outer electrode.

However, when the inner conductor is formed while being co-fired along with ceramics in the manner noted above, the ceramic multilayer parts require additional outer electrodes. In that case, it may be taken into consideration to use a paste for inner electrodes as that for outer electrodes. However, for outer electrodes, when they are formed around irreversible devices and the like, they must not lower the Q value of the devices and must have good solder wettability. For their mechanical properties, the outer electrodes must have good adhesiveness to the devices, especially in severe conditions of heat cycle and the like. However, the outer electrodes made of the paste for inner electrodes do not meet the requirements.

SUMMARY OF THE INVENTION

The object of the invention is to provide a conductor paste for outer electrodes having excellent mountability, high reliability in mounting and excellent electric properties for inner electrode co-fired, non reciprocal devices and the like, and to provide the non reciprocal devices comprising it.

The object is attained by any of the following constitutions (1) to (6):

(1) A conductor paste composition comprising a conductive material that contains silver as the essential component, and an inorganic binder as dispersed in a vehicle, wherein;

said inorganic binder contains, in terms of oxides, from 10 to 60% by weight of lead oxide (PbO), from 5 to 15% by weight of boron oxide ($B_2O_3$), from 2 to 15% by weight of silicon oxide ($SiO_2$), from 0.1 to 15% by weight of manganese oxide (MnO), and from 0.1 to 80% by weight of vanadium oxide ($V_2O_5$).

(2) The conductor paste composition of (1), wherein said conductive material has a mean grain size of from 1.0 to 10 $\mu$m.

(3) The conductor paste composition of (1) or (2), wherein the content of said inorganic binder is from 0.5 to 10% by weight relative to said conductive material.

(4) The conductor paste composition of any of (1) to (3), wherein said inorganic binder has a mean grain size of from 0.1 to 20 $\mu$m.

(5) The conductor paste composition of any of (1) to (3), wherein;

said inorganic binder contains lead oxide-boron oxide-silicon oxide-manganese oxide as glass frit, and contains vanadium oxide as a metal oxide.

(6) An non reciprocal device having an outer electrode as formed by firing the conductive paste composition of any of (1) to (5).

DESCRIPTION OF PREFERRED EMBODIMENTS

Figure 1:
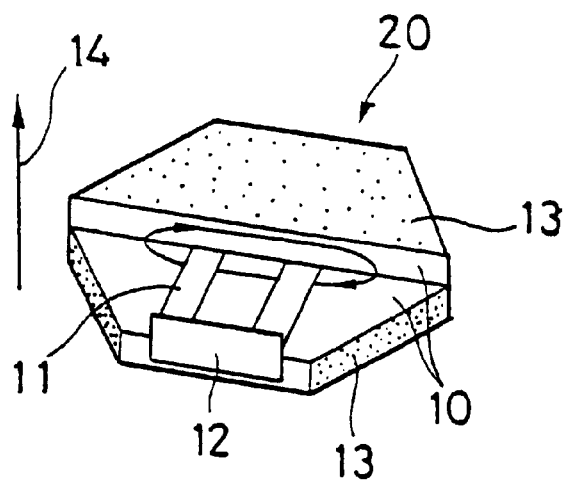
FIG. 1 is a partly-cleaved, perspective view showing the outline of the constitution of a magnetic rotator of a three-terminal circulator.

The conductor paste of the invention comprises a conductive material that contains silver as the essential component, and an inorganic binder as dispersed in a vehicle, in which said inorganic binder contains, in terms of oxides;

from 10 to 60% by weight of lead oxide,
from 5 to 15% by weight of boron oxide,
from 2 to 15% by weight of silicon oxide,
from 0.1 to 15% by weight of manganese oxide, and
from 0.1 to 80% by weight of vanadium oxide, preferably,
from 20 to 50% by weight of lead oxide,
from 8 to 13% by weight of boron oxide,
from 4 to 10% by weight of silicon oxide,
from 1 to 10% by weight of manganese oxide, and
from 20 to 70% by weight of vanadium oxide.

Of those, in general, lead oxide, boron oxide, silicon oxide and manganese oxide are the components of glass frit, and vanadium oxide is a metal oxide. Preferably, the glass frit has a softening point falling between 400 and 600° C. or so.

The reasons for defining the inorganic binder are as follows:

In case where lead oxide and boron oxide are less than the defined ranges, the softening point of the glass is too high, thereby resulting in that the sinterability of the conductor such as Ag or the like is much retarded and good Q characteristics could not be obtained. On the other hand, in case where they are more than the defined ranges, the softening point of the glass is too low, thereby resulting in that the glass components will diffuse too much into element assemblies and lower the adhesion strength of the assemblies.

In case where silicon oxide is less than the defined range, the components are difficult to vitrify; but in case of more than the range, the softening point of the glass is too high.

In case where manganese oxide and vanadium oxide are less than the defined ranges, the diffusion of lead oxide into element assemblies is much promoted to lower the adhesion strength of the assemblies. However, in case of more than the ranges, the components, especially vanadium oxide bleed out on the electrode surface to lower the solder wettability of the surface.

The inorganic binder components are generally in the form of PbO for lead oxide, $B_2O_3$ for boron oxide, $SiO_2$ for silicon oxide, MnO for manganese oxide and $V_2O_5$ for vanadium oxide; and the glass is in the form of PbO—$B_2O_3$—$SiO_2$—MnO. These may overstep in some degree their stoichiometric composition.

In the conductor paste of the invention, the inorganic binder is preferably from 0.5 to 10% by weight, more preferably from 1 to 5% by weight, relative to the conductive material therein. In case where the inorganic binder content is less than the defined range, the composition could not ensure satisfactory adhesion strength. However, in case of more than the range, the inorganic binder will bleed out on the electrode surface to lower the solder wettability of the surface. Though not specifically defined, the mean grain size of the conductive material and the inorganic binder preferably falls between 0.1 and 10 μm or so.

The conductive material indispensably contains Ag, and is preferably 100% Ag. In addition to Ag, however, the conductive material may further contain one or more of Au, Pd and Pt. The additional elements may be in the form of alloys with Ag, but may be in the form of independent grains mixed with Ag. Preferably, the total amount of the additional elements is at most 10 wt % relative to Ag.

The conductive material and the inorganic binder are dispersed in a vehicle to obtain the outer conductor paste of the invention. The vehicle comprises an organic binder and a solvent. The organic binder is not specifically defined, and may be suitably selected from any ones generally used as binders for conductor pastes. The organic binder includes ethyl cellulose, acrylic resins, butyral resins, etc. The solvent includes terpineol, butyl carbitol, kerosene, etc. The amount of the organic binder and the solvent in the paste is not specifically defined and may be any ordinary one. For example, the organic binder content may fall between 1 and 5% by weight or so, and the solvent content may fall between 10 and 50% by weight or so. The vehicle content of the conductor paste is preferably between 5 and 70% by weight. It is desirable that the viscosity of the conductor paste is controlled to fall between 300 and 300,000 ps (poises) or so.

The outer conductor paste may optionally contain various dispersants. It is desirable that the total amount of the dispersants is at most 1% by weight.

The thickness of the outer conductor is not specifically defined and may be suitably determined depending on its use. In general, it may fall between 5 and 50 μm or so.

After having been formed, the outer conductor may be plated with Ni, Sn, Pb—Sn alloy or the like. The plating improves the solder wettability of the outer conductor. The metal plate layer may be single-layered or multi-layered. Preferably, Ni/Pb—Sn alloy or Sn are formed in that order. The Sn content of the Pb—Sn alloy is preferably from 10 to 80% by weight. The thickness of the plate layer preferably falls between 0.1 and 10 μm or so.

Core Element

The magnetic material for constituting the core element is not specifically defined, and various magnetic materials may be used for it. For example, preferred is garnet-type ferrite of the like that consists essentially of yttrium oxide and iron oxide, and, in particular, more preferred is YIG (yttrian•iron•garnet: $Y_3Fe_5O_{12}$). If desired, it may contain manganese oxide, aluminium oxide and rare earth oxides in an amount of from 0.001 to 30% by weight.

Inner Conductor

The conductive material for the inner conductor is not specifically defined, but is preferably a noble metal capable of being fired or sintered in air, as it must be co-fired along with the ferrite core. As the noble metal, preferred are Ag, Au, Pd and Pt, and especially preferred is Ag. In this case, employable is the fused conductor method described in the applicant's own Japanese Patent Application No. Hei-8-197156 mentioned above. Specifically, used is a conductor paste comprising a conductive material that contains silver as the essential component, and a metal oxide as dispersed in a vehicle, in which the metal oxide is one or more of Ga oxides, La oxides, Pr oxides, Sm oxides, Eu oxides, Gd oxides, Dy oxides, Er oxides, Tm oxides and Yb oxides and the amount of the metal oxide is from 0.1 to 20 parts by weight relative to 100 parts by weight of the conductive material. The conductor paste is sandwiched between layers of a magnetic material, and fired at a temperature not lower than the melting point of the conductive material but lower than the boiling point thereof, thereby forming inner conductor layers and magnetic layers.

In the firing or sintering step, the metal oxides in the conductor paste reacts with the magnetic material, and the resulting product lowers the interfacial energy of silver. As a result, the wettability of the fused silver is increased, and the silver conductor uniformly diffuses through the inner conductor layer area in element assemblies to prevent the formation of voids therein. Since no void is formed, no gas that may expand in voids, if any, causes cracking of element assemblies. In addition, most of the above-mentioned metal oxides react with element assemblies, while fired, and diffuse thereinto, and substantially no oxide shall exist in the conductor. Accordingly, the inner conductor layers shall have the conductor resistance of pure silver, or their conductor resistance is nearly the same as that of pure silver.

The thickness of the inner conductor is not specifically defined, and may be suitably determined depending on its use. In general, it may fall between 5 and 100 μm or so.

The solder wettability (contact angle) of the outer conductor is preferably not larger than 35°, more preferably from 5° to 35°, in terms of the mean contact angle. The adhesion strength is preferably not smaller than 1.5 kg, more preferably from 1.5 to 3 kg. Regarding its adhesion test, the outer conductor is printed on a YIG substrate to form an electrode pattern having a predetermined shape thereon, a lead wire is soldered onto the electrode surface, and the lead wire is pulled, using a tensile tester, to determine the adhesion strength of the outer conductor. The solder wettability of the outer conductor may be determined as follows. A pattern of the outer conductor having a predetermined shape is formed on a YIG substrate, a plurality of solder balls having a predetermined size are put on the pattern, the thus-processed substrate is passed through a re-flow furnace, and the contact angle between each ball and the pattern surface is measured. The data are averaged, and the average value indicates the solder wettability of the outer conductor.

Next, the outer conductor paste of the invention and a method for producing an irreversible device comprising it are described below.

The irreversible device of the invention is produced by forming a green core having an inner conductor therein through ordinary sheeting, printing or the like using a magnetic paste and an inner conductor paste, then firing it, thereafter forming an outer conductor around it through dipping, printing, transferring or the like, and firing it.

Magnetic Paste

The magnetic paste is prepared by kneading a magnetic material and an organic vehicle. In general, the magnetic material is powder having the intended magnetic composition. The method for producing the magnetic material is not specifically defined. For example, employed is dry synthesis of calcining a mixture of $Y_2O_3$, $Fe_2O_3$ and other side components for solid-phase reaction. Alternatively, a precipitate as formed through co-precipitation, sol-gel reaction, alkali hydrolysis, precipitation mixing or the like is mixed with other side components, and the resulting mixture is calcined to obtain the magnetic material. As the side components, employed are one or more of oxides and various compounds capable of being fired into oxides, for example, carbonates, oxalates, nitrates, hydroxides, organic metal compounds, etc.

The mean grain size of the magnetic material may be determined, depending on the me an grain size of the magnetic layer to be formed from the material. In general, the magnetic material may be powder having a mean grain size of from 0.3 to 3.0 μm or so.

The organic vehicle is prepared by dissolving a binder in an organic solvent. The binder for the organic vehicle is not specifically defined, and may be any one having been exemplified hereinabove for the out er conductor. The organic solvent is not also specifically defined, and may be selected from any ones having been exemplified hereinabove for the outer conductor paste, in accordance with the printing method, the sheeting method and other methods to be employed for the magnetic paste.

Inner Conductor Paste

The inner conductor paste is prepared by kneading the above-mentioned, various conductive metals and alloys and the above-mentioned organic vehicle. If desired, various oxides, organic metal compounds, resinates, and others may be added thereto. The kneading method may be controlled by means of a three-roll system or the like.

Outer Conductor Paste

The outer conductor paste is pre pared by dispersing a conductive material and the specific inorganic binder of the invention in the above-mentioned vehicle, and kneading them in a three-roll system or the like.

Organic Vehicle Content

The organic vehicle content of each paste mentioned above is not specifically defined, but may be any ordinary one. For example, the binder content may fall between 1 and 5% by weight, and the solvent content may fall between 10 and 50% by weight. Each paste may contain, if desired, one or more additives of various dispersants, plasticizers, dielectric substances, insulating substances, etc. It is desirable that the total amount of those additives is at most 10% by weight.

Formation of Green sheet

In the sheeting method, the magnetic paste is used to form green sheets, which are then cut into predetermined shapes. Two green sheets are prepared for one substrate. In these, formed are through-holes for ensuring the interconnection of inner electrodes for upper and lower layers, using a punching machine or the like. On the green sheets thus having the through-holes, an inner electrode paste is printed to form a predetermined pattern thereon, and dried. A plurality of green sheets having no through-hole are placed one upon another, and the green sheet having the through-holes is placed on these, and other green sheets are further placed thereon. These were laminated under heat and pressure to prepare a green sheet. The overall thickness of the green sheet is, though not specifically defined, generally from 0.5 to 2.0 mm or so.

Binder Removal and Sintering Step

It is desirable that binder removal is effected under the condition mentioned below.

Heating rate: 5 to 300° C./hr, especially 10 to 100° C./hr.

Heating temperature at which the green sheet is kept heated: 400 to 600° C., especially 450 to 550° C.

Heating time for which the green sheet is kept heated at the heating temperature: 0 to 1 hour, especially 0 to 0.5 hours.

Atmosphere: in air.

After the binder removal, the green sheet is sintered. The atmosphere for the sintering may be suitably determined, depending on the type of the conductive material in the inner conductor paste, but, preferably, the green sheet is sintered in air.

It is desirable that sintering step is effected under the condition mentioned below.

Heating rate: 100 to 500° C./hr, especially 200 to 400° C./hr.

Firing temperature at which the green sheet is kept heated for firing: 1300 to 1550° C., especially 1400 to 1500° C.

Firing time for which the green sheet is kept heated at the firing temperature: 0.5 to 3 hours, especially 1 to 2 hours.

Cutting Step

The fired substrate is cut into cores having a predetermined shape. For this, a dicing machine or the like may be used.

Coating Step for Outer Conductor Paste

The outer conductor paste prepared is applied onto the cores having been prepared in the manner mentioned above. The coating method is not specifically defined. For example, transferring, printing or the like may be employed. Transferring is preferred for the side surfaces of the cores at which the inner conductors are exposed outside; but printing is preferred for the upper and lower surfaces to be earthed. The thickness of the outer conductor paste to be applied to each core is not specifically defined, and may be suitably controlled depending on the size of the sintered chips to be coated with the paste. In general, however, the thickness may fall between 10 and 100 µm or so. After having been thus coated with the outer conductor paste, the chips are dried. It is desirable that the chips are dried at a temperature falling between 60 and 150° C. for 10 minutes to 1 hour or so.

Sintering step for Outer Conductor

The chips thus coated with the outer conductor in the manner mentioned above are fired. Regarding the firing condition, for example, it is desirable that they are fired in air at a temperature falling between 700 and 900° C. In general, they are fired in a belt conveyor furnace or the like. In this case, the chips may pass through the belt conveyor furnace over a period of from 30 minutes to 2 hours or so, and the firing time for which the chips are kept heated at the firing temperature may fall between 0 and 30 minutes or so.

If desired, a plate layer may be formed over the outer conductor. Preferred examples of the plate layer are mentioned hereinabove, which may be formed in any ordinary plating method of electrolytic plating, electroless plating or the like.

One example of the non reciprocal devices to which the invention is preferably applied is a circulator, which will be described hereinunder. The circulator to which the invention is preferably applied is illustrated in JP-A-6-343005. This comprises a magnetic rotator. The magnetic rotator comprises an inner conductor, an insulating magnetic part as co-fired and integrated with the inner conductor in such a manner that the part surrounds the inner conductor in a close-contact condition, a plurality of terminal electrodes as electrically connected with one end of the inner conductor, a plurality of capacitors each bonded to each terminal electrode so as to resonate with the high frequency to be imparted to the electrodes, and a permanent magnet for excitation by which a direct magnetic field is imparted to the magnetic rotator. In the circulator having that constitution, no discontinuous area exists in the magnetic part. In this, therefore, the high-frequency magnetic flux forms a continuous closed loop in the magnetic rotator, but does not form any no anti-magnetic field. For these reasons, the circulator can be small-sized, the band for it can be broadened, the loss in it can be reduced, and its price can be reduced.

Figure 2:
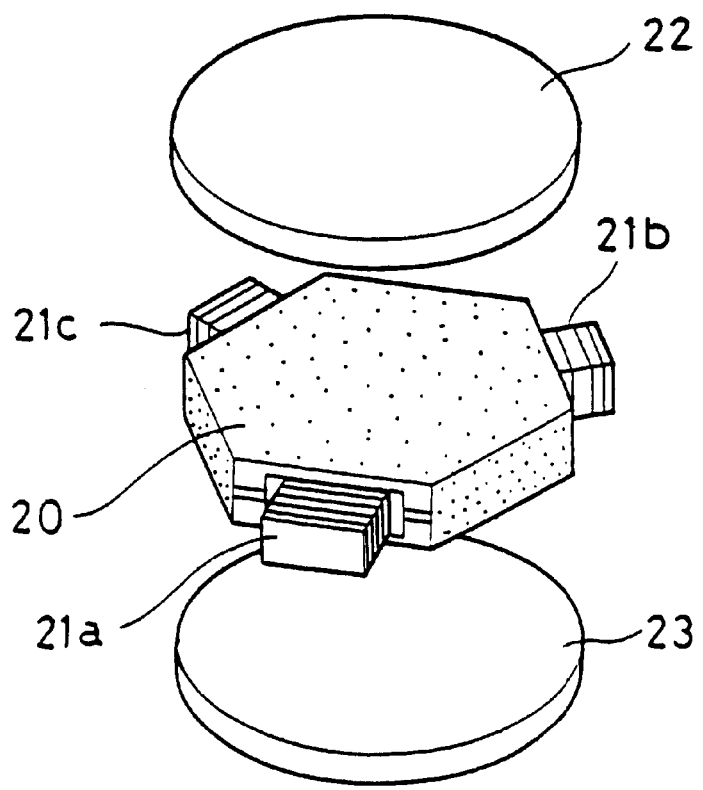
FIG. 2 is an exploded perspective view showing the entire constitution of a three-terminal circulator.
Figure 3:
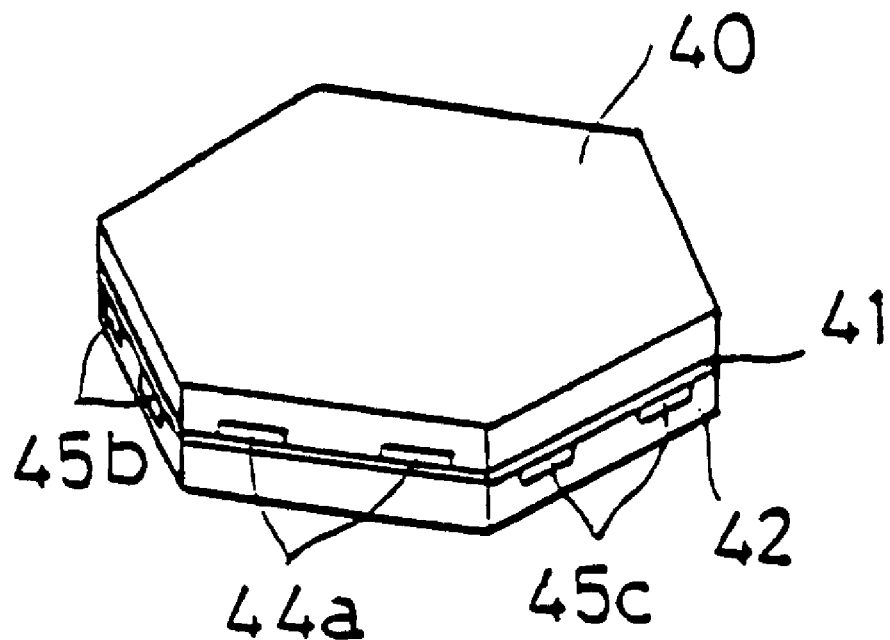
FIG. 3 is a perspective outline view for explaining a part of the production process for the magnetic rotator of FIG. 1.
Figure 4:
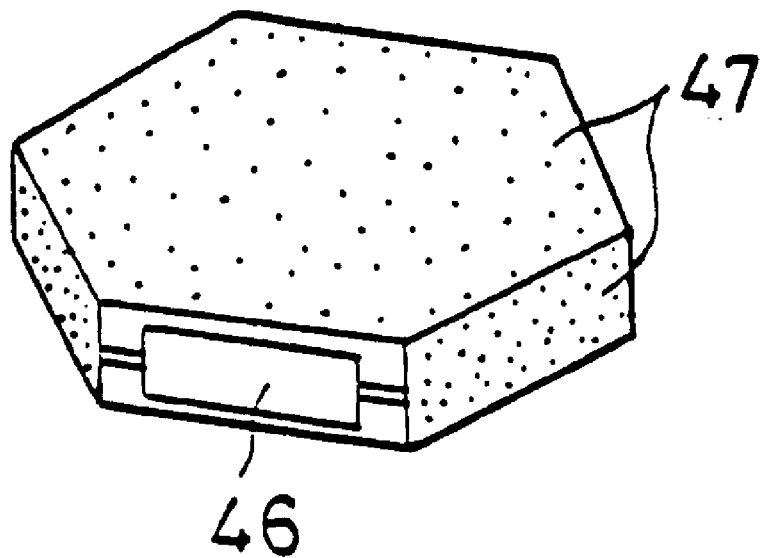
FIG. 4 is a perspective outline view for explaining another part of the production process for the magnetic rotator of FIG. 1.

FIG. 1 is a partly-cleaved, perspective view showing the outline of the constitution of the magnetic rotator of a three-terminal circulator, which is one example of the circulator mentioned above. FIG. 2 is an exploded perspective view showing the entire constitution of the circulator. FIG. 3 and FIG. 4 are views for explaining a part of the production process for the magnetic rotator of the circulator.

As illustrated, the circulator is of a three-terminal type. In this, therefore, the magnetic rotator 20 is so constructed that its planar structure is in the form of an equilateral hexagon. However, its planar structure is not always limited to such an equilateral hexagon but may be in any form of non-equilateral hexagons or other polygons, provided that the magnetic rotator can produce a uniform rotating magnetic field. In the magnetic rotator of which the planar structure is polygonal as illustrated, the non-occupied space can be effectively utilized when circuit devices such as resonance capacitors and others are attached thereto around it, there resulting in that the entire size of the magnetic rotator can be reduced.

In FIG. 1, 10 is a magnetic layer as co-fired in a body, and an inner conductor (core conductor) 11 having a predetermined pattern is formed while being surrounded by the magnetic layer 10. The inner conductor 11 is provided with strip-like coil patterns each extending in three radial directions (vertical to at least one side of the hexagon). The strip-like coil patterns extending in the same direction are electrically connected with each other. In that constitution, the magnetic layer acts as an insulator. One end of each coil pattern is electrically connected with an outer electrode 12 provided alternately at the side surfaces of the magnetic layer 10. An earth conductor (ground electrode) 13 is provided on the upper and lower surfaces of the magnetic layer 10 and on the side surfaces thereof not provided with the outer electrode 12 of the magnetic layer 10. The other end of each coil pattern is electrically connected with the earth conductor 13 at each side surface.

As in FIG. 2 showing the entire constitution of the circulator, the three outer electrodes (12) of the magnetic rotator 20 are electrically connected with resonance capacitors 21a, 21b and 21c, respectively. For these capacitors, preferred are high-frequency capacitors, for example, lead-through high-frequency capacitors for high self-resonant frequency, such as those previously proposed and disclosed by the applicant in JP-A-5-251262. Using such lead-through capacitors, for which the operating frequency range is broad, in the circulator prevents the lowering of the Q value of the circulator.

Above and below the magnetic rotator 20, provided are permanent magnets for excitation 22 and 23 (see FIG. 2), respectively, by which a direct-current magnetic field 14 (see FIG. 1) is imparted to the magnetic rotator 20.

Next, a method for producing the circulator having the constitution noted above is described with reference to FIGS. 3 and 4.

An upper sheet 40, an interlayer sheet 41 and a lower sheet 42, all made from the same insulating magnetic material, are prepared. In general, the thickness of the upper sheet 40 and the lower sheet 42 falls between 0.5 and 2 mm or so, for which a plurality of sheets each having a thickness of from 100 to 200 µm or so (preferably 160 µm) are laminated. The thickness of the interlayer sheet 41 falls between 30 and 200 µm or so, preferably about 160 µm.

As the magnetic material, generally used is a garnet-type ferrite for high frequency. As the garnet-type ferrite for high frequency, preferred is a YIG (yttrium-iron-garnet)-type one. Concretely, it may be a substituted garnet ferrite having a basic composition of $Y_3Fe_5O_{12}$ to which are added various elements. When the composition of the substituted garnet ferrite is represented by a formula:

$$(Y_{3-x}A_x)(Fe_{5-y1-y2}B'_{y1}B''_{y2})O_{12},$$

the element A to substitute for Y may be at least one of Ca and Gd, and additionally at least one of Ho, Dy and Ce as minor additives that are for improving the characteristics of the compound. The element $B'$ to substitute for Fe may be at least one of V, Al, Ge and Ga; $B''$ may be at least one of Sn, Zr and In, and additionally at least one of Mn, Co and Si as minor additives that are for improving the characteristics of the compound. The amount of substitution is preferably as follows:

$0 \leq x \leq 1.5$,
$0 \leq y1 \leq 1.5$,
$0 \leq y2 \leq 0.5$.

The atomic ratio of the characteristics-improving minor additives in the formula noted above is generally at most 0.2. The ratio of (Y including substituent elements):(Fe including substituent elements):O may be shifted from the stoichiometric ratio of 3:5:12.

The sheets of the magnetic material are formed from a magnetic paste comprising the magnetic material and a vehicle.

On the upper surfaces of the interlayer sheet 41 and the lower sheet 42, formed are three pairs of coil patterns of two strip-like patterns, which are upper inner conductors 44a and lower inner conductors 45b and 45c, respectively. These are formed through printing or transferring of an inner conductor paste on each surface. Each pattern in each pair extends in the same radial direction (vertical to at least one side of the hexagon). The upper sheet 40, the interlayer sheet 41 and the lower sheet 42 thus formed in the manner noted above are laminated in order and stacked up under heat and pressure. As a result, the tri-symmetrical coil patterns are disposed on the both surfaces of the interlayer sheet 41. Because of their symmetrical configuration, all the terminals of the three-terminal circulator shall have the same propagation characteristic.

The stack of the upper sheet 40, the interlayer sheet 41 and the lower sheet 42 as in FIG. 3 is fired at a temperature not lower than the melting point of the conductive material but lower than the boiling point thereof. The firing may be effected once or plural times. When fired plural times, at least one firing shall be effected at a temperature not lower than the melting point of the conductive material. As a result of the firing, the magnetic material constituting the upper sheet 40, the interlayer sheet 41 and the lower sheet 42 is in a continuous condition, and the sheets are integrated together.

In FIG. 3, the upper sheet 40, the interlayer sheet 41 and the lower sheet 42 are described to be equilateral hexagons. In the present invention, however, since these sheets are fired at a temperature not lower than the melting point of the conductive material, they are cut, after having been fired, so as to prevent the melt of the conductive material from flowing out.

As a result of the sintering step noted above, one end of the upper inner conductors 44a is electrically connected with one end of the lower inner conductors 45b, 45c via a conductor.

After having been fired and cut, each magnetic rotator is barrel-polished whereby the inner conductors to be at the side surfaces are exposed outside, and chamfered at the corners of the sintered body. Next, as in FIG. 4, an outer electrode 46 is formed by firing it alternately at the side surfaces of the magnetic rotator, and an earth conductor 47 is on the upper and lower surfaces of the magnetic rotator and at the side surfaces thereof not provided with the outer electrode 46 of the magnetic rotator. As a result, the other end of the upper inner conductors 44a exposed outside at the side surfaces of the magnetic rotator is electrically connected with each outer electrode (46), while the other end of the lower inner conductors 45b, 45c exposed outside at the side surfaces of the magnetic rotator is electrically connected with the earth conductor (47) on each side surface of the magnetic rotator. To each outer electrode (46) of the magnetic rotator, fitted are the resonance capacitors 21a, 21b and 21c, as in FIG. 2, by re-flow soldering or the like. Next, a metal housing that acts both as a permanent magnet for excitation and a magnetic yolk for imparting a direct-current magnetic field to the magnetic rotator is constructed around the magnetic rotator to complete a circulator.

The construction example mentioned above is for a three-terminal circulator. Without being limited to only the illustrated one, the present invention is applicable to any other multi-terminal circulators. In addition, apart from the lumped parameter circulators mentioned above, the invention is further applicable to distributed parameter circulators in which the magnetic rotator is integrated with the capacitor circuit and an impedance converter is built in the terminal circuit for broadening the operating frequency range. Developing circulators such as those mentioned above, according to the invention, makes it easy to construct other non reciprocal devices such as isolators, etc.

EXAMPLES

Next, concrete examples of the present invention are described below.

Example 1

Essential magnetic materials, $Y_2O_3$ (mean grain size: 1.0 μm) and $Fe_2O_3$ (mean grain size: 1.0 μm) were mixed to prepare a stoichiometric composition of $Y_3Fe_5O_{12}$. Apart from this, prepared were additives of $Mn_3O_4$ and $Al_2O_3$ in an amount of 1% by weight and 0.5% by weight, respectively, relative to $Y_3Fe_5O_{12}$. These powdery materials were mixed in water in a ball mill, and dried. The resulting powdery mixture was calcined at 1300° C. for 4 hours to prepare a magnetic material. The thus-calcined powder was ground, to which were added an organic binder of acrylic resin and an organic solvent of methylene chloride and acetone, and further mixed to obtain a slurry. The resulting slurry was sheeted into magnetic green sheets through doctor blading.

Next prepared was an inner conductor comprised of Ag powder (mean grain size: 4.0 μm) and $Ga_2O_3$ in an amount of 1.6% by weight relative to Ag, to which were added an organic binder of acrylic resin and ethyl cellulose resin, and an organic solvent of butyl carbitol and hexyl carbitol. These were kneaded in a three-roll mixing system to prepare an inner conductor paste.

Also prepared was an outer conductor material comprised of Ag powder (mean grain size: 4.0 μm) and an inorganic binder, of which the composition is shown in Table 1, in an amount of 2% by weight relative to Ag, to which were added an organic binder of acrylic resin and ethyl cellulose resin, and an organic solvent of butyl carbitol and hexyl carbitol. These were kneaded in a three-roll mixing system to prepare an outer conductor paste.

In order to obtain a predetermined thickness, a plurality of magnetic green sheets were stacked up, and then laminated with another green sheet on which a through-conductor paste had been printed, and finally with a predetermined number of still other green sheets, and these were bonded together through thermal compression to obtain a green sheet.

Next, the resulting green sheet was sintered in air at 1480° C. for 1 hour to obtain a sintered substrate. The resulting sintered substrate was cut into predetermined, symmetric hexagonal cores. The side surfaces of each core at which the inner conductor was exposed outside, and the upper and lower surfaces thereof were coated with the outer conductor paste, dried, and sintered in air at 850° C. for 10 minutes, whereby an outer conductor was formed around each core. Thus were obtained non reciprocal devices.

The initial adhesion strength of the outer conductor for the non reciprocal devices, the adhesion strength thereof after 100 heat cycles (−40° C. to +85° C.—in each cycle, the retention time at each temperature was 1 hour), the solder wettability (contact angle) thereof, and the Q value thereof were measured. Briefly, the adhesion strength of the outer conductor was measured as follows: An electrode pattern having a square size of 2 mm×2 mm was printed on a YIG substrate, a lead wire was soldered onto the electrode surface, and the lead wire was pulled, using a tensile tester, to determine the adhesion strength of the outer conductor. After the heat cycle test, the adhesion strength of the outer conductor was measured in the same manner as above. The solder wettability of the outer conductor was measured as follows. A pattern of the outer conductor having a rectangular size of 40 mm×50 mm was formed on a YIG substrate, ten solder balls having a diameter of 1 mm were put on the pattern, the thus-processed substrate was passed through a re-flow furnace, and the contact angle between each ball and the pattern surface was measured. The data were averaged. The Q characteristic of each device was measured at 850 MHz. The data obtained are shown in Table 1.

TABLE 1

| Sample No. | Compositional Ratio of Inorganic Binder | | | | | Amount Added (wt %) | Adhesion Strength (kg) | | Contact Angle (°) | Q |
|---|---|---|---|---|---|---|---|---|---|---|
| | PbO | $B_2O_3$ | $SiO_2$ | MnO | $V_2O_5$ | | Initial Value | After Heat Cycle | | |
| 1* | 7* | 13 | 10 | 10 | 60 | 2 | 1.2 | 0.7 | 35 | 87 |
| 2* | 75* | 5 | 2 | 2 | 12 | 2 | 1.0 | 0.3 | 38 | 150 |
| 3* | 46* | 4* | 10 | 10 | 30 | 2 | 1.1 | 0.7 | 40 | 78 |
| 4* | 49* | 16* | 10 | 10 | 15 | 2 | 1.4 | 0.5 | 36 | 140 |
| 5* | 50 | 15 | 1* | 10 | 34 | 2 | 0.4 | 0.1 | 44 | 80 |
| 6* | 50 | 15 | 18* | 10 | 7 | 2 | 1.4 | 0.7 | 38 | 81 |
| 7* | 30 | 10 | 5 | 0* | 55 | 2 | 2.6 | 0.9 | 37 | 134 |
| 8* | 30 | 10 | 10 | 17* | 33 | 2 | 2.2 | 1.8 | 87 | 100 |
| 9* | 60 | 20 | 13 | 7 | 0* | 2 | 2.4 | 0.6 | 30 | 144 |
| 10* | 10 | 5 | 2 | 1 | 82 | 2 | 2.5 | 1.6 | 80 | 98 |
| 11* | 10 | 15 | 10 | 8 | 57 | 2 | 2.5 | 2.0 | 33 | 145 |
| 12 | 60 | 10 | 10 | 10 | 5 | 2 | 2.6 | 2.1 | 38 | 143 |
| 13 | 30 | 5 | 6 | 4 | 55 | 2 | 2.2 | 1.9 | 30 | 140 |
| 14 | 40 | 15 | 5 | 1 | 39 | 2 | 2.4 | 1.9 | 32 | 144 |
| 15 | 20 | 15 | 1 | 10 | 54 | 2 | 2.4 | 2.1 | 29 | 150 |
| 16 | 30 | 5 | 6 | 1 | 58 | 2 | 2.2 | 2.0 | 30 | 147 |
| 17 | 20 | 5 | 6 | 16 | 53 | 2 | 2.0 | 1.9 | 32 | 151 |
| 18 | 60 | 15 | 15 | 9 | 1 | 2 | 2.4 | 1.9 | 27 | 140 |
| 19 | 10 | 5 | 2 | 3 | 80 | 2 | 2.2 | 2.1 | 27 | 149 |
| 20 | 30 | 10 | 6 | 4 | 50 | 2 | 2.7 | 2.5 | 22 | 155 |
| 21* | 30 | 10 | 6 | 4 | 50 | 0.1* | 0.3 | 0.1 | 30 | 130 |
| 22* | 30 | 10 | 6 | 4 | 50 | 11* | 2.1 | 2.1 | 87 | 88 |

*indicates overstepping the scope of the invention

The above Examples verify the advantages of the invention.

Advantages of the Invention

As has been described hereinabove, the invention provides a conductor paste for outer electrodes having excellent mountability, high reliability in mounting and excellent electric properties for inner electrode co-fired, non reciprocal devices, and provides the non reciprocal devices comprising it.

What is claimed is:

1. A conductor paste composition comprising a conductive material that contains silver as the essential component, and an inorganic binder as dispersed in a vehicle, wherein; said inorganic binder contains, in terms of oxides,
   from 10 to 60% by weight of lead oxide (PbO),
   from 5 to 15% by weight of boron oxide ($B_2O_3$),
   from 2 to 15% by weight of silicon oxide ($SiO_2$),
   from 0.1 to 15% by weight of manganese oxide (MnO), and
   from 0.1 to 80% by weight of vanadium oxide ($V_2O_5$)
      wherein the content of said inorganic binder is from 0.5 to 10% by weight based on said conductive material.

2. The conductor paste composition as claimed in claim 1, wherein said conductive material has a mean grain size of from 1.0 to 10 $\mu$m.

3. The conductor paste composition as claimed in claim 1, wherein said inorganic binder has a mean grain size of from 0.1 to 20 $\mu$m.

4. A non reciprocal device having an outer electrode formed by firing the conductive paste composition of claim 1.

* * * * *

UNITED STATES PATENT AND TRADEMARK OFFICE
CERTIFICATE OF CORRECTION

PATENT NO. : 6,110,569

DATED : August 29, 2000

INVENTOR(S): Katsuhiko IGARASHI

It is certified that an error appears in the above-identified patent and that said Letters Patent is hereby corrected as shown below:

On the Title Page, Item [54], and Column 1, the Title is listed incorrectly.
Item [54] and Column 1 should read as follows:

--- [54] CONDUCTIVE PASTE AND IRREVERSIBLE CIRCUIT DEVICE USING THE SAME ---

Signed and Sealed this

First Day of May, 2001

Attest:

NICHOLAS P. GODICI

Attesting Officer  Acting Director of the United States Patent and Trademark Office